United States Patent [19]
Agostinelli et al.

[11] Patent Number: 5,552,373
[45] Date of Patent: Sep. 3, 1996

[54] JOSEPHSON JUNCTION DEVICE COMPRISING HIGH CRITICAL TEMPERATURE CRYSTALLINE COPPER SUPERCONDUCTIVE LAYERS

[75] Inventors: John A. Agostinelli, Rochester; Jose M. Mir, Webster; Gerrit Lubberts; Samuel Chen, both of Penfield, all of N.Y.

[73] Assignee: Eastman Kodak Company, Rochester, N.Y.

[21] Appl. No.: 867,063

[22] Filed: Apr. 10, 1992

Related U.S. Application Data

[63] Continuation of Ser. No. 615,936, Nov. 15, 1990, abandoned.

[51] Int. Cl.$^6$ .......................... H01L 29/06; H01L 39/22
[52] U.S. Cl. .......................... 505/190; 505/237; 257/31; 257/33
[58] Field of Search .......................... 357/4, 5; 505/190, 505/237; 257/31, 32, 33

[56] References Cited

U.S. PATENT DOCUMENTS

| | | | |
|---|---|---|---|
| 4,586,062 | 4/1986 | Bouffard et al. | 357/5 |
| 4,874,741 | 10/1989 | Shaw et al. | 505/1 |
| 4,880,770 | 11/1989 | Mir et al. | 505/1 |

(List continued on next page.)

OTHER PUBLICATIONS

Bednorz and Mueller, Z. Phys. B–Condensed Matter 64, pp. 189–193 (1986) "Possible High $T_c$ Superconductivity in the Ba–La–Ca–O System".

Koch, Umbach, Clark, Chaudhari, and Laibowitz, Appl. Phys. Lett. 51(3), Jul. 20, 1987, pp. 200–202, "Quantum interference devices made from superconducting oxide thin films".

Rogers, Inam, Hegde, Dutta, Wu, and Venkatesan, Appl. Phys. Lett 55(19) Nov. 6, 1989, pp. 2032–2034, "Fabrication of heteroepitaxial $YBa_2Cu_3O_{7-x}$–$PrBa_2Cu_3O_{7-x}$ Josephson devices grown by laser deposition".

Dijkkamp and Venkatesan, Wu, Shaheen, Jisrawi, Min–Lee, McLean, and Croft, Appl. Phys. Lett. 51(8), Aug. 24, 1987, 619–621, "Preparation of Y–Ba–Cu oxide superconductor thin films using pulsed laser evaporation from high $T_c$ bulk material".

Wu, Xi, Li, Inam, Dutta, DiDomenico, & Weiss, Martinez, Wilkens, Schwarz, Barner, Chang, Nazar, and Venkatesan, Appl. Phys. Lett. 56(4) Jan. 22, 1990, pp. 400–402, "Superlattices of $Y–Ba–Cu–O/Y_y–Pr_{1-y}–Ba–Cu–O$ grown by pulsed laser deposition".

Agostinelli et al U.S. Serial No. 532,479, filed Jun. 4, 1990, titled "A Cubic Perovskite Crystal Structure, A Process of Preparing the Crystal Structure, and Articles Constructed from the Crystal Structure".

Primary Examiner—Sara'W. Crane
Attorney, Agent, or Firm—Raymond L. Owens

[57] ABSTRACT

A Josephson junction device is disclosed having a substrate upon which are located overlying and underlying high critical temperature crystalline oxide superconductive layers separated by an interposed impedance controlling layer. The underlying superconductive layer is limited to a selected area of the substrate while the overlying and interposed layers overlie only a portion of the underlying superconductive layer. Nonsuperconducting oxide layer portions laterally abut the superconductive and interposed layers. A first electrical conductor is attached to the underlying superconductive layer at a location free of overlying oxide layers, and a second electrical conductor contacts the overlying superconductive layer and extends laterally over the adjacent laterally abutting nonsuperconductive layer portion. A process is disclosed for preparing the Josephson junction device in which a Josephson junction layer sequence is deposited on a substrate, a portion of the Josephson junction layer sequence laterally abutting a selected area is converted to a nonsuperconducting form, within the selected area overlying layers are removed from the superconducting layer nearer the substrate, and an electrical conductor extends laterally from the superconducting layer farther removed from the substrate to the laterally abutting nonsuperconducting layer.

10 Claims, 2 Drawing Sheets

U.S. PATENT DOCUMENTS

| | | | |
|---|---|---|---|
| 4,891,355 | 1/1990 | Hayashi et al. | 505/1 |
| 4,902,671 | 2/1990 | Koinuma et al. | 505/1 |
| 4,916,116 | 4/1990 | Yamazaki | 505/1 |
| 4,925,829 | 5/1990 | Fujita et al. | 505/1 |
| 4,929,595 | 5/1990 | Wu | 505/1 |
| 4,931,425 | 6/1990 | Kimura et al. | 505/1 |
| 4,933,317 | 6/1990 | Johnson et al. | 505/1 |
| 4,933,318 | 6/1990 | Heijman | 505/1 |
| 4,935,403 | 6/1990 | Yamaoki | 505/1 |
| 4,937,226 | 6/1990 | Nishiguchi | 505/1 |
| 4,940,693 | 7/1990 | Shappiro et al. | 505/1 |
| 4,942,142 | 7/1990 | Itozaki et al. | 505/1 |
| 4,942,152 | 7/1990 | Itozaki et al. | 505/1 |
| 4,960,753 | 10/1990 | Collins et al. | 505/1 |
| 4,962,086 | 10/1990 | Gallagher et al. | 505/1 |
| 4,970,395 | 11/1990 | Kruse, Jr. | 357/5 |
| 5,034,374 | 7/1991 | Awaji et al. | 357/5 |
| 5,047,390 | 9/1991 | Higashino et al. | 357/5 |
| 5,057,491 | 10/1991 | Housley | 357/5 |
| 5,061,971 | 10/1991 | Takemura | 357/4 |

JOSEPHSON JUNCTION DEVICE COMPRISING HIGH CRITICAL TEMPERATURE CRYSTALLINE COPPER SUPERCONDUCTIVE LAYERS

RELATED APPLICATION

This application is related to Agostinelli et al U.S. application Ser. No. 532,479, filed Jun. 4, 1990, A CUBIC PEROVSKITE CRYSTAL STRUCTURE, A PROCESS OF PREPARING THE CRYSTAL STRUCTURE, AND ARTICLES CONSTRUCTED FROM THE CRYSTAL STRUCTURE.

This application is a continuation, of application Ser. No. 07/615,936 filed Nov. 15, 1990, now abandoned.

FIELD OF THE INVENTION

The invention relates to the field of superconductivity, specifically high temperature superconductivity. More specifically the invention relates to electrically active devices that exhibit superconductivity under at least one condition of use at high temperatures and to processes for their preparation.

BACKGROUND

Since the initial publication of Bednorz and Mueller, "Possible High $T_c$ Superconductivity in the Ba-La-Cu-O System", Z. Phys. B-Condensed Matter 64, p. 189–193 (1986), investigation has revealed a large family of crystalline oxides which exhibit superconductivity at higher temperatures than previously thought possible. The terms "high temperature superconductor" and "high temperature superconductive" are herein employed to describe as a class those crystalline oxides that are capable of exhibiting superconductivity at temperatures greater than 30° K.—i.e., $T_o$>30° K. Shappirio et al U.S. Pat. No. 4,940,693 and Itozaki et al U.S. Pat. Nos. 4,942,142 and 4,942,152 provide extensive (but not comprehensive) lists of high temperature superconductive crystalline oxides.

While high temperature superconductors can be employed to advantage simply for their high conductivity characteristics, it has been recognized that high temperature superconductive materials can be used to advantage to construct active elements for electrical circuits. One such active element is a Josephson junction device. In such a device conductivity between two superconductive regions is controlled by an interposed region capable of conducting paired electrons between the superconductive regions under one condition of use, but not another. For example, a Josephson junction device may exhibit no measurable impedance at a low current density, but switch to a higher impedance at an increased current density with device impedance being controlled by the interposed region.

A simple form of Josephson junction device is disclosed by Koch et al, "Quantum Interference Devices Made from Superconducting Thin Films", Appl. Phys. Lett. 51(3), Jul. 20, 1987, pp. 200–202. Although Koch et al set out to prepare a Josephson junction device that switched as a result of a region joining two larger superconductive areas, investigation revealed switching to result from Josephson coupling of the superconducting grains.

Other Josephson junction devices have been reported in which two high temperature superconductive crystalline oxide layers are separated by an impedance controlling layer. Low temperature (<30° K.) Josephson junction devices have been reported using niobium as well as organic materials (Bouffard et al U.S. Pat. No. 4,586,062). Josephson junction devices prepared using high temperature superconductive crystalline oxide layers are reported by Rogers et al, "Fabrication of Heteroepitaxial $YBa_2Cu_3O_{7-x}$–$PrBa_2Cu_3O_{7-x}$–$YBa_2Cu_3O_{7-x}$ Josephson Devices Grown by Laser Deposition", Appl. Phys. Lett. 55(19), Nov. 6, 1989, pp. 2032–2034; Yamazaki U.S. Pat. No. 4,916,116; Johnson et al U.S. Pat. No. 4,933,317 and Agostinelli et al U.S. Ser. No. 532,479, filed Jun. 4, 1990, A CUBIC PEROVSKITE CRYSTAL STRUCTURE, A PROCESS OF PREPARING THE CRYSTAL STRUCTURE, AND ARTICLES CONSTRUCTED FROM THE CRYSTAL STRUCTURE", commonly assigned.

Various techniques for the deposition of high temperature superconductive crystalline oxide thin films are known. One of the earliest successfully demonstrated techniques of producing a high temperature superconductive crystalline oxide thin film is that of Mir et al U.S. Pat. No. 4,880,770, which thermally decomposed metallorganic precursors. Sputtering has been employed extensively to prepare crystalline oxide thin films, as illustrated by Koinuma et al U.S. Pat. No. 4,902,671; Wu U.S. Pat. No. 4,929,595; Yamaoki et al U.S. Pat. No. 4,935,403; Nishiguchi et al U.S. Pat. No. 4,937,226; Collins et al U.S. Pat. No. 4,960,753 and Gallagher et al U.S. Pat. No. 4,962,086. Vapor deposition techniques have been employed, as illustrated by Fujita et al U.S. Pat. No. 4,925,829 and Kimura et al U.S. Pat. No. 4,931,425. Laser ablation deposition has been demonstrated by Shaw et al U.S. Pat. No. 4,874,741; Rogers et al, cited above; Agostinelli et al, cited above; Dijkkamp et al "Preparation of Y-Ba-Cu Oxide Superconductor Thin Films Using Pulsed Laser Evaporation From High $T_c$ Bulk Material", App. Phys. Lett. 51(8), 24 Aug. 1987, pp. 619–621; and Wu et al "Superlattices of Y-Ba-Cu-O/$Y_y$-$Pr_{1-y}$-Ba-Cu-O Grown by Pulsed Laser Deposition", Appl. Phys. Lett. 56(4), 22 Jan. 1990, pp. 400–402.

Various techniques for patterning high temperature superconductive crystalline oxides have been demonstrated. Mir et al, cited above, suggests laser patterning and patterning using photoresists and etchants. Hayashi et al U.S. Pat. No. 4,891,355 suggests laser addressing a superconductive thin film to convert the film to a nonsuperconductive form. Koch et al, cited above, employed ion implantation to convert a superconductive thin film to an insulative form. Similar ion implantation techniques used for other purposes are disclosed by Yamazaki et al, cited above. Heijman U.S. Pat. No. 4,933,318 discloses ion milling to pattern a superconductive thin film.

SUMMARY OF THE INVENTION

Despite the intensive level of investigation that has followed the discovery of high temperature superconductive crystalline oxides and the recognition that these oxides can be fabricated into Josephson junction devices, a Josephson junction device construction that satisfies practical circuit performance and manufacturing requirements such as high yield (minimal risk of device damage in fabrication), simplicity of fabrication steps, and structural compatibility with circuit construction requirements, has yet to be suggested. The purpose of this invention is then to satisfy each of these unmet needs with an improved Josephson junction device construction and a novel process for its preparation.

In one aspect this invention is directed to a Josephson junction device comprised of a substrate and a Josephson junction layer sequence comprised of an underlying high temperature superconductive crystalline oxide layer, an overlying high temperature superconductive crystalline oxide layer, and an impedance controlling crystalline oxide layer interposed between the superconductive layers.

The Josephson junction device is characterized in that the underlying superconductive crystalline oxide layer is located on the substrate in a selected area, a first nonsuperconductive oxide layer portion lies on the substrate in an area laterally abutting the selected area, the impedance controlling crystalline oxide layer overlies the underlying superconductive layer in only a portion of the selected area to leave a portion of the underlying superconductive crystalline oxide layer free of an overlying oxide layer, a second nonsuperconductive oxide layer portion overlies the first nonsuperconductive oxide layer and laterally abuts the impedance controlling layer, the overlying superconducting crystalline oxide layer overlies only the impedance controlling layer, a third nonsuperconductive oxide layer portion overlies only the second nonsuperconductive oxide layer and laterally abuts the overlying superconducting crystalline oxide layer, and an electrical conductor is attached to the overlying superconductive crystalline oxide layer and extends laterally over at least a portion of the third nonsuperconductive oxide layer portion.

In another aspect this invention is directed to a process of preparing a device comprised of a support and a thin film high temperature superconductive oxide conductor confined to a selected area of a major surface of the support comprised of the steps of (i) initially forming the thin film high temperature superconductive oxide conductor on the major surface of the support without confinement to the selected area, (ii) protecting the thin film high temperature superconductive oxide conductor in an area corresponding to the selected portion of the major surface of the support, and (iii) removing at least a portion of the thin film high temperature superconductive oxide conductor not confined to the selected area of the major surface of the support.

The process is characterized in that (a) the thin film high temperature superconductive oxide conductor is initially formed on the substrate in the form of a Josephson junction layer sequence comprised of an underlying superconductive crystalline oxide layer, an overlying superconductive crystalline oxide layer, and an impedance controlling crystalline oxide layer interposed between the superconductive layers, (b) the superconductive oxide conductor is converted to a nonsuperconductive layer portion in an area laterally abutting the selected area, (c) within a portion of the first selected area the overlying and impedance controlling layers are removed to reveal the underlying superconductive crystalline Oxide layer, and (d) an electrical conductor is provided in contact with the overlying superconductive crystalline oxide layer within the first selected area and extending over at least a portion of the laterally abutting nonsuperconductive layer portion.

The drawings are schematic in nature with device feature dimensions being exaggerated both in an absolute and relative sense to facilitate visualization.

DESCRIPTION OF PREFERRED EMBODIMENTS

Figure 1:
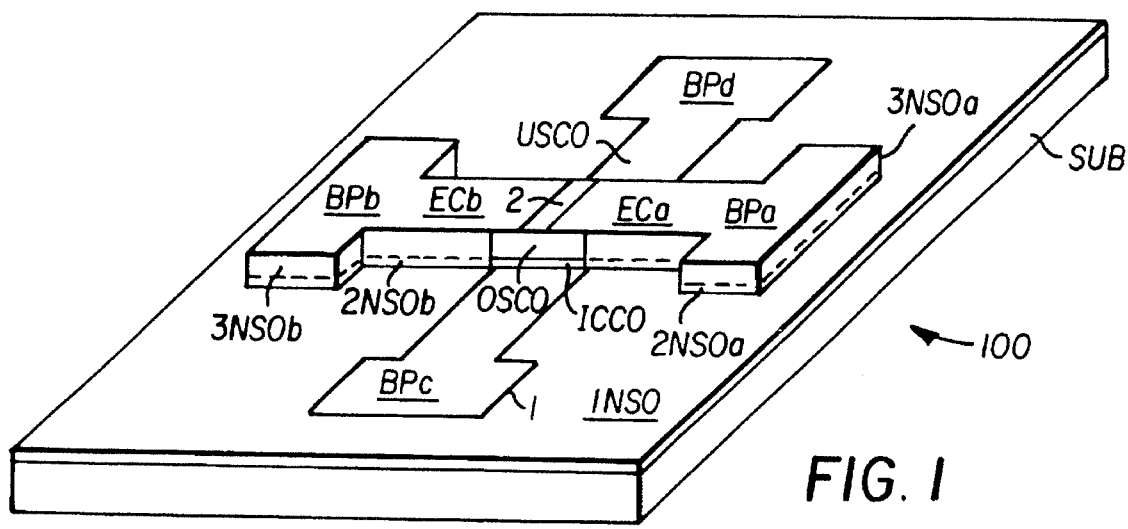
FIG. 1 is an isometric view of a Josephson junction device satisfying the requirements of the invention.

A Josephson junction device 100 is shown in FIG. 1. The device as shown consists of a substrate SUB. Located on the substrate is an underlying superconductive crystalline oxide layer USCO confined with a selected area defined by a boundary 1. A first nonsuperconductive oxide layer portion 1NSO overlies the remainder of the upper surface of the substrate, laterally abutting USCO along boundary 1.

An impedance controlling crystalline oxide layer ICCO overlies a central portion of USCO. Located on 1NSO and laterally abutting ICCO are two second nonsuperconductive oxide layer portions 2NSOa and 2NSOb. The lateral boundaries between ICCO and 2NSOa and 2NSOb are along boundary 1. Therefore, ICCO is entirely confined within the selected area while 2NSOa and 2NSOb are entirely excluded.

An overlying superconductive crystalline oxide layer OSCO overlies and is confined to the area of ICCO. Located on and confined to 2NSOa and 2NSOb, respectively, are third nonsuperconducting oxide layer portions 3NSOa and 3NSOb. The lateral boundaries between OSCO and 3NSOa and 3NSOb are along boundary 1. Therefore, OSCO is entirely confined within the selected area while 3NSOa and 3NSOb are entirely excluded.

The overlying superconductive crystalline oxide layer OSCO, the impedance controlling crystalline oxide layer ICCO, and the portion of the underlying superconductive crystalline oxide USCO that underlies OSCO and ICCO form a Josephson junction layer sequence that is capable of conducting electricity with no measurable resistance under one condition of use and capable of switching to a nonsuperconducting mode when another condition is imposed.

For the Josephson junction layer sequence to perform its intended active circuit function it is essential that the device be constructed in a manner that provides for circuit connection with minimal risk to the operating characteristics of the device. In the device 100 electrically conductive layers ECa and ECb overlie 3NSOa and 3NSOb, respectively, and each extend across the boundary 1 and overlie a portion of OSCO. ECa and ECb in extending laterally beyond the Josephson junction layer sequence provide bonding pads BPa and BPb, respectively, each at a location laterally remote from the Josephson junction layer sequence. This avoids subjecting the electrically active portion of the device to the stresses characteristic of bond attachment—e.g., any one or combination of pressure, heat and ultrasound.

In extending the electrical conductors laterally the underlying nonsuperconductive oxide layer portions provide an important role. In the absence of 1NSO, 2NSOa and 3NSOa extending ECa laterally from OSCO would run the risk of contacting USCO and thereby shunting the impedance controlling crystalline oxide layer ICCO. One valuable function which 1NSO, 2NSOa and 3NSOa play is then to electrically separate ECa from USCO and ICCO. The same function is, of course, also provided by the corresponding nonsuperconductive layer portions underlying ECb.

A second valuable function which the nonsuperconductive oxide layer portions underlying each of ECa and ECb perform is to present these electrical conductors with an essentially planar (flat or high radius of curvature) supporting surface. Short radius of curvature bends, such as those that would be required around the edge of OSCO in the absence of the abutting nonsuperconductive oxide layer portions, are avoided. Short radius of curvature bends are sites known to increase the risk of electrical conductor discontinuities. They usually constitute sites of maximum physical stress. Additionally, the essentially planar nonsuperconductive oxide supporting surfaces for the electrical conductors ECa and ECb reduce the risk of electrical conductor discontinuities that can occur at surfaces that are oriented at different angles. For example, where ECa and ECb are formed by vapor phase deposition techniques, such as sputtering, the essentially planar nonsuperconductive oxide supporting surfaces intended to receive ECa and ECb can be entirely optimally oriented (e.g., oriented normal or near normal) to the path of coating material. Whereas, if any part of the supporting surfaces were oriented at different angles, there is a risk of one or more surface portions being less favorably oriented with respect to the coating material source, resulting in a thinned coating portion or even a discontinuity, as can be produced by shadowing effects. In actual device manufacturing the presence of the nonsuperconductive oxide layer portions underlying the electrical contacts ECa and ECb can be expected to result in increased yields of high performance devices, thereby avoiding the manufacture of devices that either fail or show less than optimum performance capabilities.

As shown, a lateral gap 2 exists between electrical conductors ECa and ECb. This allows independent electrical addressing of the Josephson junction layer sequence with each of ECa and ECb. It is, of course, possible to simplify construction by eliminating ECb, 2NSOb and 3NSOb. In such instance ECa is preferably extended laterally to cover the entire upper surface of the Josephson junction layer sequence.

The portions of USCO extending laterally beyond the Josephson junction layer sequence within the selected area defined by boundary 1 also provide convenient laterally offset sites for electrical conductor attachment. As shown, USCO is laterally extended to provide bonding pads BPc and BPd. Thus, the device, as shown, is provided with two sites for electrical connection to USCO. It is recognized that lateral extension to only one of BPc and BPd is essential to providing a device satisfying the requirements of the invention.

In practice lead attachments to BPa and BPc can be used to complete a current conducting circuit while separate leads can be attached to BPb and BPd to complete a separate circuit or circuit portion intended to monitor the voltage drop, if any, across the Josephson junction layer sequence.

The device 100 has been shown as a discrete single circuit element device. It is, however, recognized that the device can be readily adapted to accommodate hybrid or integrated circuit features. A large portion of 1NSO and the entire backside of the substrate S are not occupied and can readily serve as a supporting surface for other active or passive circuit components.

Although the device 100 has been shown as having a single Josephson junction active portion, it is appreciated that the invention can readily accommodate construction of devices having any number of Josephson junction active portions electrically isolated or connected in series or parallel on a single substrate. When multiple circuit elements are formed on a single substrate, instead of attaching leads at each of the bonding pads the geometrical pattern of the area represented by one or more of the bonding pads can be configured to provide a conduction path to an adjacent device on the substrate.

Figure 2:
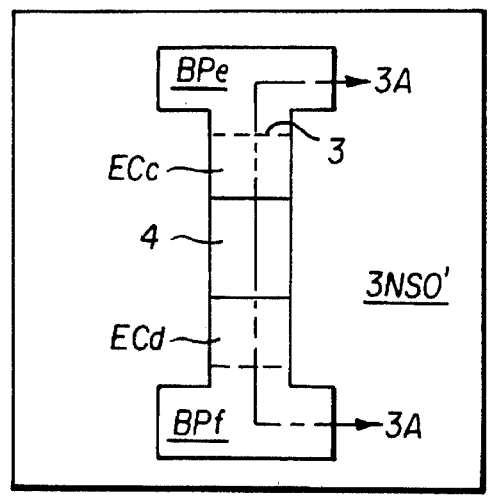
FIG. 2 is a plan view of a second embodiment of the invention, showing two Josephson junction devices on a single substrate.
Figure 3:
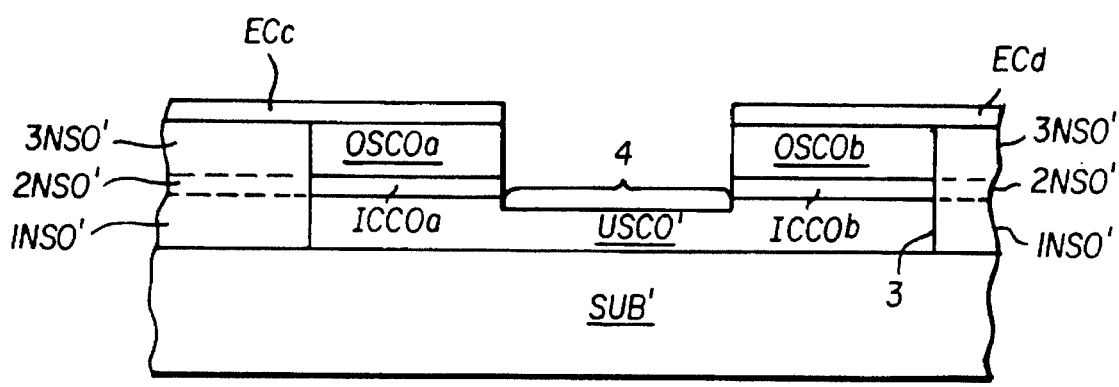
FIG. 3 is a view along section line 3A—3A in FIG. 2, but shown on an enlarged scale.
Figure 7:
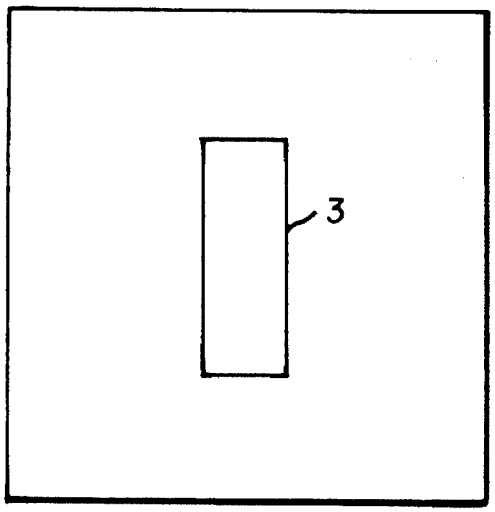
FIGS. 7 and 8 are plan views showing patterns, corresponding to those of FIGS. 5 and 6, respectively, but illustrating intermediate construction stages of the device of FIGS. 2 and 3.

Device 200, shown in FIG. 2 and 3, illustrates a device containing two Josephson junction active portions electrically connected in series. The substrate SUB' can be identical to that of device 100. An underlying superconductive crystalline oxide layer USCO' can be identical to the corresponding layer in device 100. As shown in device 200 USCO' is confined to a first selected area indicated by boundary 3 (most clearly illustrated in FIG. 7). Laterally abutting USCO' along boundary 3 is a first nonsuperconductive oxide layer portion 1NSO'. Overlying USCO' at spaced locations within the selected area defined by boundary 3 are two layers ICCOa and ICCOb each similar to ICCO of device 100. In area 4 between ICCOa and ICCOb the underlying superconductive crystalline oxide layer USCO' is free of any overlying oxide. Overlying ICCOa and ICCOb, respectively, are OSCOa and OSCOb, each similar to OSCO of device 100.

Laterally abutting ICCOa and ICCOb along boundary 3 is 2NSO' (similar to 2NSOa and 2NSOb), and laterally abutting OSCOa and OSCOb along boundary 3 is 3NSO' (similar to 3NSOa and 3NSOb). As shown the nonsuperconductive layer portions are each continuous and laterally surround the boundary 3. The upper surface of 3NSO' forms an essentially planar lateral extension of the upper surfaces of OSCOa and OSCOb. Therefore, essentially planar surfaces are provided for ECc and ECd which extend from OSCOa and OSCOb laterally over a portion of 3NSO' to laterally offset bonding pads BPe and BPf, respectively. Not only is an essentially planar surface provided for formation of ECc, ECd, BPe and BPf, but a large additional area of 3NSO' remains unoccupied surrounding the boundary 3 that is available for construction of other circuit elements, if desired. Having all of the upper surfaces of the device, except for a relatively small area 4, lying in essentially the same plane is, of course, recognized to be highly advantageous for circuit construction for the reasons provided in describing the features of device 100.

Figure 4:
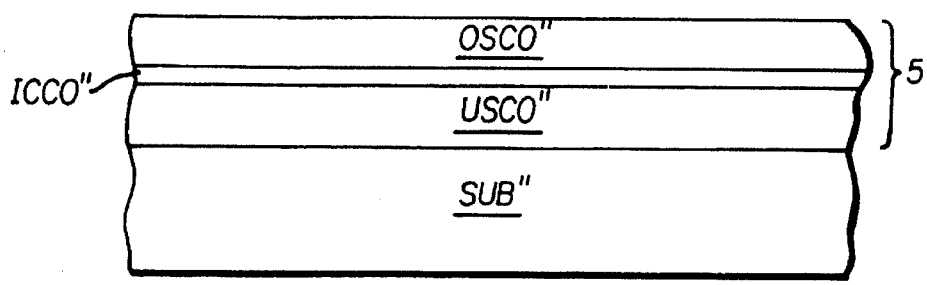
FIG. 4 is an edge view of a Josephson junction layer sequence on a substrate.

In constructing Josephson junction devices 100 and 200 a common starting point, shown in FIG. 4, is a substrate SUB" bearing a Josephson junction layer sequence 5, which, as shown, consists of an underlying superconductive crystalline oxide layer USCO" located on the substrate, an impedance controlling crystalline oxide layer ICCO", and an overlying superconductive oxide layer OSCO". The substrate can take any conventional form known to be capable of supporting the formation of a high temperature superconductive crystalline oxide layer. Initially the Josephson junction layer sequence extends laterally beyond the Josephson junction layer sequence boundaries of the completed device. It is usually most convenient for the Josephson junction layer sequence as initially formed to overlie the entire upper surface of the substrate.

The Josephson junction layer sequence can be chosen to be either the S-I-S or S-N-S type. In this invention S in each occurrence represents a high temperature superconductive ($T_o > 30°$ K.) Crystalline oxide. More specifically, USCO" is one of the S layers while OSCO" is the other.

ICCO" layer can take the form of either an I or an N layer. To complete an S-I-S layer sequence ICCO" must be formed of an electrically insulative material having a bulk resistivity in the order of $10^{10}$ ohm-cm or higher. Additionally, in its I form ICCO" must have a thickness of at least a crystal lattice monolayer (e.g., at least 5Å). ICCO" preferably has at thickness of less than 30Å, but with decreasing levels of resistance ICCO" can be increased up to 100Å in thickness. In an ideal S-I-S Josephson junction layer sequence ICCO" is believed to support superconductivity in its low impedance state primarily by permitting tunneling of paired electrons (Cooper pairs), which are the recognized charge carriers in superconductive structures.

Unlike S-I-S layer sequences, when ICCO" completes an S-N-S layer sequence, superconductivity through the ICCO" layer in its low impedance state cannot be explained by current theories of tunneling behavior. S-N-S layer sequences are said to rely on experimentally verified, but theoretically less well understood "proximity effects" to support superconductivity. To achieve a proximity effect capable of supporting superconductivity at a temperature of greater than 30° K. the bulk resistivity of the material forming layer ICCO" is greater than $10^{-6}$ ohm-cm and is preferably greater than $10^{-3}$ ohm-cm. In addition ICCO" must have a thickness of less than 10,000 Angstroms, preferably less than 5000 Angstroms, and optimally less than 100 Angstroms. Where proximity effects rather than tunneling are being relied upon for superconductivity in ICCO", it is usually convenient to form ICCO" with a thickness of at least about 10 Angstroms.

Regardless of whether the Josephson junction layer sequence 5 is characterized as S-I-S or S-N-S, the layers USCO", ICCO" and OSCO" are each crystalline oxide layers. Since layer ICCO" must be quite thin, it important that the underlying high temperature superconductive oxide layer USCO" present a smooth surface for deposition of ICCO". Surface irregularities on USCO" are most conveniently minimized by constructing USCO" as a thin film. As employed herein the term "thin film" is employed to indicate a layer thickness of less than 5 μm. Preferably USCO" has a thickness of less than 1 μm.

Successful device construction also depends on not unduly restricting the thickness of layer USCO". Device layers USCO and USCO' that are formed from USCO" must be thick enough to conduct current laterally from the active area of the Josephson junction devices 100 and 200 without exceeding the critical current density of the superconductive crystalline oxide from which they are formed. Additionally, at a subsequent stage in the processing, described below, overlying oxide layers must be removed while leaving USCO and USCO' intact. The layer USCO" must be thick enough to allow for some thinning as a way of insuring complete removal of the overlying oxide layers. For USCO and USCO' each to have a thickness of at least 500 Angstroms USCO" must have a thickness greater than 500 Angstroms. In an optimum construction USCO and USCO' each have a thickness at least 5000 Angstroms, and USCO" has a thickness of greater than 5000 Angstroms.

For reasons that will become apparent from subsequent description of the process of preparation, all of the superconductive crystalline oxide layers of the Josephson junction layer sequence are contemplated to be thin films. As herein employed, the term "thin film" indicates a thickness of less than 5 μm. Preferably, none of the superconductive crystalline oxide layers exceed 1 μm in thickness.

After the underlying superconductive crystalline oxide layer USCO" is formed on the substrate, the impedance controlling crystalline oxide layer ICCO" is epitaxially grown over USCO". During epitaxial growth the crystal orientation of ICCO" is controlled by that of USCO". Similarly, once formed, ICCO" provides a deposition surface for the epitaxial growth of the overlying superconductive crystalline oxide layer OSCO". It is an important and highly advantageous feature of this invention that USCO", ICCO" and OSCO" can each be formed in rapid succession, optimally in the same controlled environment, without any intervening device fabrication steps being required. This avoids any risk of degrading the exposed upper surfaces of layers USCO" or ICCO" during formation of the layer sequence and thereby degrading either the purity or crystal structure of ICCO" or OSCO" as they are subsequently formed.

Since layer OSCO" need not serve as a substrate for further crystalline oxide deposition and, unlike layer USCO", need not support current conduction laterally to any appreciable extent, even thinner layer thicknesses are possible than in constructing layer USCO". OSCO" need not serve as a substrate for further epitaxial deposition, and therefore, unlike the formulation of USCO", this is not a consideration for limiting its thickness. However, since thickening OSCO" increases the amount of material that must be subsequently removed in device preparation, it is preferred to construct OSCO" as a thin film. Any minimum thickness of OSCO" capable of insuring a continuous film can be employed. It is generally preferred that OSCO" having a thickness of at least about 0.1 micrometer. It is usually convenient to form USCO" and OSCO" within the same thickness ranges.

Once the Josephson junction layer sequence is formed on the substrate the next step in device fabrication is to convert the portion of the layer sequence lying outside a selected area to a nonsuperconductive form, preferably an insulative form (i.e., a form having a bulk resistivity of at least $10^{10}$ ohm-cm). This is accomplished by first protecting the Josephson junction layer sequence in the selected area. In forming the device 100 the selected area is defined by boundary 1 in FIG. 5, and in forming the device 200 the selected area is defined by boundary 3 in FIG. 7. With the selected area protected, the remaining, unprotected portion of the Josephson junction layer sequence is converted to a nonsuperconductive form. This can be accomplished, for example, by bombarding the unprotected surface of the Josephson junction layer sequence with ions capable of entering the unprotected crystalline oxide layers and converting these layers to a nonsuperconductive and, preferably, an insulative form. Ions implanted by bombardment can be either those that by their presence inhibit superconductivity (i.e., convert the layers from a superconductive to a nonsuperconductive composition), those that destroy the crystal structure essential to support superconductivity without introducing ions that are incompatible with superconductivity, or those that achieve a combination of both effects. It is preferred to use ions that are not incompatible with superconductivity to destroy the crystal structure that supports superconductivity (i.e., to convert the superconductive crystalline oxides to nonsuperconductive, preferably insulative, amorphous oxides), since this avoids any possibility of subsequent device degradation by migration of incompatible ions into the selected active area of the device. Koch et al, "Quantum Interference Devices Made from Superconducting Thin Films", Appl. Phys. Lett. 51(3), Jul. 20, 1987, pp. 200–202, cited above and here incorporated by reference, reports conversions of the type contemplated by oxygen bombardment at an energy of 0.25 to 1 MeV and a dose of $10^{14}$ to $5\times10^{15}$ ions/cm$^2$ or arsenic bombardment at an energy of 1 to 2.5 MeV and a dose of $10^{14}$ to $5\times10^{14}$ ions/cm$^2$. Oxygen silicon and gold ions are preferred for implantation. It is, of course, appreciated that overall thickness of the Josephson junction layer sequence 5 must be small enough to permit ion penetration of each of layers OSCO", ICCO" and OSCO". This is another reason for forming these layers of a minimum acceptable thickness.

The selected area can be protected from conversion to a nonsuperconductive form by any convenient conventional technique. In a preferred form of the invention one or a combination of period 5 and/or 6 metals are coated to overlie the selected area. Tantalum, tungsten, platinum and gold coated to a thickness of from 0.5 to 2.0 μm are examples of period 6 metal layers. Period 5 metals, such as palladium and silver, are effective at about twice the layer thickness of period 6 metals. One or more lighter metals can be mixed with or underlie the period 5 and/or 6 metals to facilitate protective layer formation and adhesion. A preferred layer combination is a chromium layer overcoated with a period 6 metal, where chromium is relied upon to improve the adhesion of the period 6 metal layer. Since no portion of the protective layers need form a part of the completed device, it is preferred to interpose an underlying layer, such as a photoresist layer, that facilitates lift off after conversion of unprotected portions of the Josephson junction layer sequence to a nonsuperconductive form. A specific step sequence for forming, patterning and later removing a protective layer is set out in the Examples.

At the completion of the ion bombardment step the Josephson junction layer sequence 5 remains intact within the selected areas defined by boundaries 1 and 3 while the portions of the originally deposited Josephson junction layer sequence laterally surrounding and laterally abutting (contiguous to) the boundaries 1 and 3 are converted to nonsuperconductive oxide layer portions. Because of the disruptions of the original crystal structure by ion bombardment the nonsuperconductive oxide layer portions may or may not remain distinguishable as separate layers. For example, if USCO", ICCO" and OSCO" are all of the same initial composition and differ only in their crystal structure, it is apparent that when the portions of these layers outside the selected area are converted to an amorphous form by ion bombardment nonsuperconductive oxide portions 1NSO, 2NSOa, 2NSOb, 3NSOa and 3NSOb in device 100 and the corresponding layer portions in device 200 may be indistinguishable in composition.

Instead of relying on ion implantation to create a nonsuperconductive oxide layer portion occupying the entire area exterior of the selected areas defined by boundaries 1 and 3, it is alternatively possible to define the selected boundaries 1 and 3 using a laser to convert the boundary abutting portions of the Josephson junction layer sequence to a nonsuperconductive form. This technique is described by Hayashi et al U.S. Pat. No. 4,891,355, cited above and here incorporated by reference.

Figure 5:
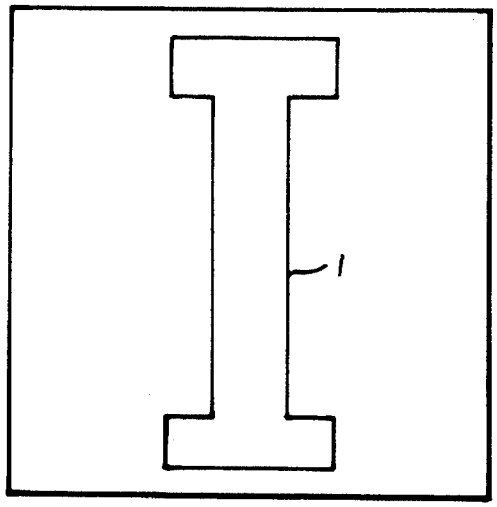
FIGS. 5 and 6 are plan views showing patterns introduced during intermediate construction stages of the device of FIG. 1.

In constructing the device 100 the next step of the process is to coat the upper surface of the intermediate workpiece having the appearance shown in FIG. 5 with the electrical conductor (e.g., metal or metals) intended to form ECa and ECb. The electrical conductor can be coated in only the areas of ECa and ECb or those areas and any additional area, except area 2. In practice it is usually most convenient to coat the electrical conductor uniformly over the upper surface of the workpiece in two areas laterally separated by the width of area 2. Since in one form of the invention ECa and ECb can together form a single electrical conductor, it is appreciated that, if desired, the electrical conductor can be simply coated over the entire upper surface of the workpiece.

In forming the device 200 electrical conductor used to form ECc and ECd is preferably coated in a pattern either confined just to areas ECc and ECd or just those areas and area 4. The purpose of patterning the electrical conductor at this stage of processing is that, unlike the fabrication of device 100, removal of unwanted oxide layer portions in subsequent steps does not simultaneously produce the electrical conductor pattern. Therefore, prior patterning offers better protection against inadvertent contamination of underlying layers than deferring patterning until unwanted portions of the oxide layers have been removed.

Figure 6:
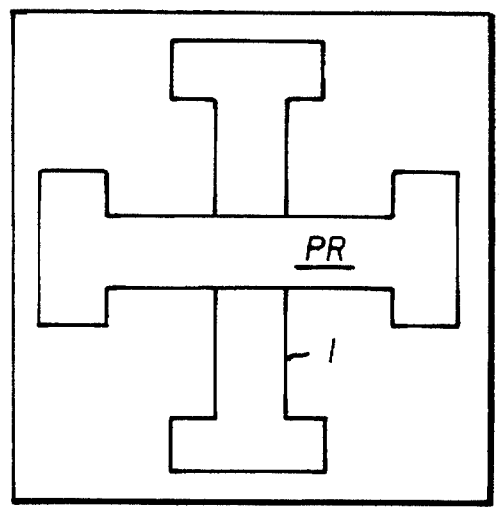
Figure 8:
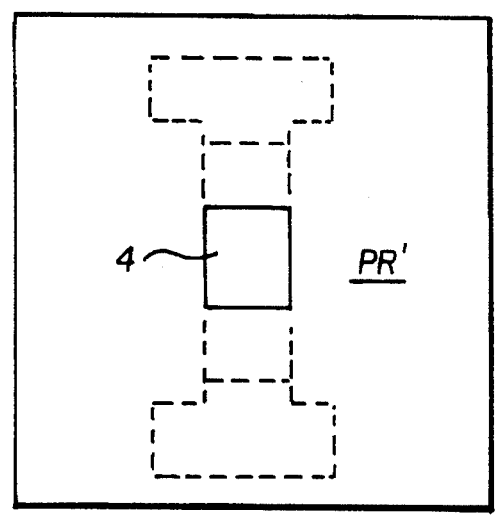

The next step in the preparation process is to remove portions of the crystalline oxide layers overlying USCO and USCO'. In constructing the device 100 this is accomplished by forming a patterned photoresist layer PR occupying only the areas of ECa, 2 and ECb, as shown in FIG. 6. In constructing the device 200 this is accomplished by forming a patterned photoresist layer PR' occupying the entire upper surface of the workpiece, except area 4, as shown in FIG. 8.

With the photoresist patterned the portions of the oxide layers not protected by PR or PR' are removed to a depth sufficient to reveal the upper surface of the underlying superconductive oxide layer USCO or USCO'. While liquid etchants can in theory be used for oxide removal, it is preferred to employ ion milling. Ion milling offers advantages in that the risk of contamination of the superconductive layers remaining by liquid impurity ions is avoided, better pattern definition is realized, no chemical degradation along edges is produced, and etch rates are more uniform. Any conventional procedure for ion milling known to be useful in patterning superconductive crystalline oxides can be employed. The technique of Heijman U.S. Pat. No. 4,933,318, cited above and here incorporated by reference, is specifically contemplated.

Upon completion of ion milling the photoresist is removed with a suitable solvent. After this step the devices 100 and 200 are in the forms shown in FIGS. 1 and 2, respectively. The devices can be put to direct use as shown or further processed, such as by formation of other circuit components on 1NSO 3NSO', SUB or SUB', lead attachment, passivation or encasement, by conventional procedures that form no part of this invention.

The substrates, the high temperature superconductive crystalline oxides and the Josephson layer sequences employed in the practice of this invention can take any convenient conventional form. A wide variety of high temperature superconductive crystalline oxides are available, as illustrated by Shappiro et al U.S. Pat. No. 4,940,693 and Itozaki et al U.S. Pat. Nos. 4,942,142 and 4,942,152, cited above and here incorporated by reference. Generally any substrate and high temperature superconductive crystalline oxide known to produce a thin film on the substrate can be employed in combination. Examples of such combinations as well as processes of depositing the thin film on the substrate are provided by Mir et al U.S. Pat. No. 4,880,770; Koinuma et al U.S. Pat. No. 4,902,671; Wu U.S. Pat. No. 4,929,595; Yamaoki et al U.S. Pat. No. 4,935,403; Nishiguchi et al U.S. Pat. No. 4,937,226; Collins et al U.S. Pat. No. 4,960,753; Gallagher et al U.S. Pat. No. 4,962,086; Fujita et al U.S. Pat. No. 4,925,829; Kimura et al U.S. Pat. No. 4,931,425. Laser ablation deposition has been demonstrated by Shaw et al U.S. Pat. No. 4,874,741; Dijkkamp et al "Preparation of Y-Ba-Cu Oxide Superconductor Thin Films Using Pulsed Laser Evaporation From High $T_c$ Bulk Material", App. Phys. Lett. 51(8), 24 Aug. 1987, pp. 619–621; and Wu et al "Superlattices of Y-Ba-Cu-O/$Y_y$-$Pr_{1-y}$-Ba-Cu-O Grown by Pulsed Laser Deposition", Appl. Phys. Lett. 56(4), 22 Jan. 1990, pp. 400–402; each cited above and here incorporated by reference. While any conventional procedure can be employed for deposition of the high temperature crystalline oxide thin films, preferred techniques of deposition, particularly for the impedance controlling and overlying superconductive crystalline oxide layers, are sputtering, laser ablation and vacuum vapor deposition, since each of these techniques can be accomplished without bringing the substrate or layers into contact with a liquid during preparation.

The substrate and Josephson junction layer sequences of Rogers et al, "Fabrication of Heteroepitaxial $YBa_2Cu_3O_{7-x}$-$PrBa_2Cu_3O_{7-x}$-$YBa_2Cu_3O_{7-x}$ Josephson Devices Grown by Laser Deposition", Appl. Phys. Lett. 55(19), Nov. 6, 989, pp. 2032–2034; Yamazaki U.S. Pat. No. 4,916,116; and Johnson et al U.S. Pat. No. 4,933,317; each cited above and here incorporated by reference, are specifically contemplated for use in the practice of this invention.

In a specifically preferred form of the invention the Josephson junction layer sequence 5 of FIG. 4 is constructed according to the teachings of Agostinelli et al U.S. Pat. Ser. No. 532,479, filed Jun. 4, 1990, A CUBIC PEROVSKITE CRYSTAL STRUCTURE, A PROCESS OF PREPARING THE CRYSTAL STRUCTURE, AND ARTICLES CONSTRUCTED FROM THE CRYSTAL STRUCTURE", commonly assigned. In this form of the invention the thin film high temperature superconductive crystalline oxide layers USCO" and OSCO" exhibit an $R_1A_2C_3$ orthorhombic perovskite crystal structure while the layer ICCO" exhibits a cubic perovskite crystal structure. The substrate SUB" can take any convenient form capable of permitting deposition of USCO" thereon as a thin film.

In a specifically preferred form of the invention SUB" is chosen from materials that themselves exhibit a perovskite or perovskite-like crystal structure. Strontium titanate is an example of a perovskite crystal structure which is specifically preferred for use as a substrate. Lanthanum aluminate ($LaAlO_3$), lanthanum gallium oxide ($LaGaO_3$) and potassium tantalate are other examples of useful perovskites. Other preferred substrates which are not perovskites include magnesia and alumina, particularly in their monocrystalline forms.

When the substrate includes one or a combination of barrier layers to serve as the deposition surface for USCO", it is recognized that a much broader choice of substrate materials are possible. Illustrations of substrates containing one or more barrier layers for the deposition of thin film high temperature superconductive oxide crystalline oxides are provided by Mir et al U.S. Pat. No. 4,880,770; Agostinelli et al U.S. Ser. No. 330,409, filed Mar. 30, 1989, now allowed; Hung et al U.S. Pat. No. 4,908,348; and Agostinelli et al U.S. Pat. No. 4,956,335; the disclosures of which are here incorporated by reference. Barrier layers are particularly useful when the substrate takes the form of monocrystalline semiconductor, such as a silicon or III–V monocrystalline semiconductor. Specifically contemplated examples of the latter are yttrium or calcium stabilized zirconia barrier layers on monocrystalline silicon or gallium arsenide substrates or alkaline earth (e.g., barium or strontium) fluoride barrier layers on monocrystalline silicon or gallium arsenide substrates.

The thin film high temperature superconductive crystalline oxide layers USCO" and OSCO" in a specifically preferred form of the invention exhibit an $R_1A_2C_3$ orthorhombic perovskite crystal structure that satisfies the relationship:

$$R_1A_2C_3O_{7-w} \qquad (I)$$

where

R, A and C represent rare earth, alkaline earth and copper atoms, respectively, capable of forming a high temperature superconductive $R_1A_2C_3$ orthorhombic perovskite crystal structure and w is in the range of from 0.5 to 0, preferably 0.3 to 0 and optimally from 0.1 to 0. Progressively higher temperatures of superconductivity can be realized as the value of w is decreased.

The cubic perovskite crystal structure that forms ICCO" in its specifically preferred form satisfies the relationship:

$$R_{0.33+z}A_{0.67}C_{1-y}O_{3-x} \qquad (II)$$

where

R, A and C represent rare earth, alkaline earth and copper atoms, respectively, capable of forming a superconductive $R_1A_2C_3$ orthorhombic perovskite crystal structure;

x is 0.67 to 1;

y is 0 to 0.2; and z is 0 to 0.1.

When comparing a cubic perovskite unit cell structure to that of a superconductive $R_1A_2C_3$ orthorhombic perovskite crystal structure unit cell, certain similarities and differences are apparent. One of the most important similarities is that the cubic perovskite unit cell exhibits dimensions that are similar to the minor axes dimensions of an $R_1A_2C_3$ orthorhombic perovskite unit cell formed of the same elements. Similarities in both unit cell facial configuration and dimensions facilitate epitaxial deposition of either crystal structure on the other.

The cubic perovskite unit cell structure can contain oxygen in the same proportions found in a corresponding $R_1A_2C_3$ orthorhombic perovskite crystal structure. In a preferred form of the invention x is in the range of from 0.67 to 0.85.

The orthorhombic perovskite unit cell structure 1:2:3 atomic ratio of rare earth:alkaline earth:copper can be present in the cubic perovskite unit cell structure. A slight excess of rare earth can be present in the preferred cubic crystal structures. In preferred cubic perovskite crystal structures z ranges from zero to 0.08. The cubic perovskite crystal structure as a bulk material does not exhibit superconductivity at temperatures at or above 30° C.—i.e., at contemplated device operating temperatures, and thus satisfies a general material requirement for use as an ICCO device layer.

Any combination of rare earth, alkaline earth and copper elements known to be capable of forming a superconductive $R_1A_2C_3$ orthorhombic perovskite crystal structure is contemplated for forming the USCO", ICCO" and OSCO" layers of the Josephson junction devices of the invention. The term "rare earth" is used to indicate group 3, periods 4, 5 and 6 elements. Scandium, yttrium and the lanthanides, other than cerium, praseodymium, promethium and terbium (i.e., the lanthanides neodymium, samarium, europium, gadolinium, dysprosium, holmium, erbium, thulium, ytterbium and lutetium), employed singly or in combination, are known to produce superconductive $R_1A_2C_3$ orthorhombic perovskite crystal structures. Yttrium and the above-identified lanthanides constitute specifically preferred rare earths. The alkaline earth elements are preferably at least 50 percent barium on an atomic basis with any additional alkaline earths being chosen from the group consisting of strontium and calcium, most preferably at least 80 percent barium on an atomic basis with the additional alkaline earth element, when present, being strontium.

A specifically preferred orthorhombic perovskite crystal structure satisfies the unit cell formula:

$$Y_1Ba_2Cu_3O_{7-w} \qquad \text{(III)}$$

where w is in the range of from 0 to 0.3, preferably 0.1.

A specifically preferred cubic perovskite crystal structure satisfies the unit cell formula:

$$Y_{0.33+z}Ba_{0.67}Cu_{1-y}O_{3-x} \qquad \text{(IV)}$$

where x represents 0.67 to 0.85;

y represents 0.05 to 0.18; and z represents up to 0.08. This unit cell formula is highly compatible with high $T_o$ $Y_1Ba_2Cu_3$ crystal structures.

The cubic perovskite crystal structures employed in the practice of this invention are novel. They can be produced by varying the conditions employed for forming $R_1A_2C_3$ orthorhombic perovskite crystal structures by the laser ablation deposition process. For example, novel cubic perovskite crystal structures can be produced by varying temperatures employed in the laser ablation deposition processes disclosed by Dijkkamp et al "Preparation of Y-Ba-Cu Oxide Superconductor Thin Films Using Pulsed Laser Evaporation From High $T_c$ Bulk Material", Appl. Phys. Lett. 51 (8), 24 August 1987, pp. 619–621; Wu et al "Superlattices of Y-Ba-Cu-O/$Y_y$-$Pr_{1-y}$-Ba-Cu-O Grown by Pulsed Laser Deposition", Appl. Phys. Lett. 56 (4), 22 January 1990, pp. 400–402; and Rogers et al "Fabrication of Heteroepitaxial $YBa_2Cu_3O_{7-x}$-$PrYBa_2Cu_3O_{7-x}$-$YBa_2Cu_3O_{7-x}$ Josephson Devices Grown by Laser Deposition, Appl. Phys. Lett. 55 (19), 2 November 1989, pp. 2032–2034, the disclosures of which are here incorporated by reference.

In the laser ablation deposition process any rare earth alkaline earth copper oxide having the rare earth, alkaline earth and copper stoichiometry of a superconductive $R_1A_2C_3$ orthorhombic perovskite crystal structure can be used as a source material. The source material can be either crystalline or amorphous. The source material is placed in an evacuated chamber adjacent a heated stage on which is mounted a substrate. The substrate is mounted in thermally conductive contact with the heated stage. The accepted and most replicable practice (here adopted) is to monitor and regulate the temperature of the heated stage. A series of laser pulses aimed at the source material is responsible for transfer of material from the bulk source to the substrate. During ablation a plasma is created containing a mixture of rare earth, alkaline earth and copper elements and ions. These elements interacting with oxygen condense on the substrate to reform a rare earth alkaline earth copper oxide. In addition to its simplicity, the process has the advantage that high vacuum conditions are not required, although they can be employed. For example, ambient pressures ranging from $1.33\times10^{-2}$ to 400 Pa ($10^{-4}$ to 300 mtorr) have been reported.

It has been discovered that by maintaining the temperature of the heated stage below (but typically within about 120° C. of) the temperature required to produce an $R_1A_2C_3$ orthorhombic perovskite crystal structure a coating of a cubic perovskite crystal structure is formed on deposition. A preferred temperature range for formation of the cubic perovskite crystal structure is in the range of from about 530 to 640° C. For yttrium barium copper oxide deposition in a cubic perovskite crystal structure an optimum temperature range is from 540 to 630° C.

A specific advantage of forming USCO" and OSCO" of a single orthorhombic perovskite crystal structure and ICCO" of a cubic perovskite crystal structure using the same rare earth and alkaline earth elements and the same 1:2:3 atomic ratio of rare earth:alkaline earth:copper is that all three layers can be formed in a single vacuum deposition sequence using a single laser ablation target. This greatly simplifies construction of the Josephson junction layer sequence and assures producing high quality surfaces in the underlayers USCO" and ICCO" for epitaxial deposition of layers ICCO" and OSCO", respectively, thereon. The fact that the orthorhomic perovskite crystal structure and the cubic perovskite crystal structure can each consist of the same elements in the same ratios minimizes any risk of impurity ion degradation of the Josephson junction layer sequence and enhances the epitaxial compatibility of the layers.

The Josephson junction devices of the invention lend themselves to a variety of uses. The devices of the invention can be used to switch from no measurable resistance at a low current density to a higher, measurable resistance at a higher current density. It is also contemplated to employ the Josephson junction devices of the invention as sensors. In one contemplated construction the Josephson junction device is biased to a region in its current-voltage hysteresis loop in which the ratio of current change to voltage change ($\Delta I/\Delta V$) is a maximum. When so biased, a small amount of heating of the Josephson junction layer sequence can produce a marked change in current. The heat can, if desired, be supplied to the device in another conveniently transmitted energy form, such as ultrasound or electromagnetic radiation, and converted to heat by absorption. In an alternative mode of operation electromagnetic radiation of an energy level capable of dissociating Cooper pairs (the paired electrons that support superconductivity), preferably electromagnetic radiation exhibiting a frequency of at least 1 terrahertz, can be directed to the impedance controlling layer. In this mode the electrical conductors (ECa–d) at least in the areas overlying the Josephson junction layer sequence are preferably formed of material that is relatively transparent to the electromagnetic radiation to be sensed. For example, if the electromagnetic radiation is light, the electrical conductors in their preferred form can conveniently be formed as a conductive transparent metal oxide, such as indium oxide, tin oxide or, most preferably, indium tin oxide.

EXAMPLES

The invention can be further appreciated by reference to the following specific examples. The term "μm" signifies micrometers. The acronyms "XRD" and "TEM" stand for X-ray diffraction and transmission electron microscopy, respectively.

Example 1

Cubic Perovskite Crystal Structure Thin Film on MgO

The title film was deposited on a {100}crystal face of a monocrystalline magnesia (MgO) substrate by laser ablation deposition.

The target material was a 2.54 cm diameter disk of bulk polycrystalline $YBa_2Cu_3O_{7-x}$ high temperature superconductor material. The target was mounted on a rotating stage and positioned in a vacuum chamber. During deposition the target rotation rate was 6 rpm.

The monocrystalline MgO substrate was 2.5×1.3 cm and was located on a resistively heated stage 5 cm from the target. The MgO substrate was mounted on the heated stage using spring clips and a silver paint thermal transfer layer between the heated stage and the substrate to facilitate efficient heat transfer. The substrate was preheated on the stage prior to deposition both to pyrolyze the paint vehicle and to clean the substrate surface of any organic residues. During this step the substrate heater block was raised to 700° C. and held at that temperature for 5 minutes.

The chamber was then pumped to a pressure of $6.7×10^{-2}$ Pa ($5×10^{-4}$ tort) and then backfilled while pumping with oxygen to a pressure of 26.7 Pa (200 mtorr) measured 20 cm away from the target. The oxygen was introduced via a tube which directed the gas toward the substrate surface. The oxygen flow rate was controlled at 20 sccm.

A 248 nm laser beam from a Lambda Physik 210i™ (KrF) excimer laser was directed on the target via a highly reflective mirror, a 500 mm high purity fused quartz lens and vacuum chamber window of a similar quartz material. The laser was operated at a repetition rate of 2 Hz with a pulse duration of about 20 ns and a pulse energy of 400 mJ. The beam spot size on target measured about 2.5×8 mm, giving a fluence near 2 $J/cm^2$.

A shutter interposed between the target and substrate was closed to permit the target to be laser addressed without depositing material on the substrate. The laser was fired for 150 pulses immediately before opening the shutter to insure that the highest possible purity of material was made available from the target.

With the shutter opened, a total of 3000 laser pulses were used to grow the film on the substrate. During deposition the heated substrate stage was maintained at 560° C. After the 3000 laser pulses the oxygen pressure in the chamber was raised to about 22.7 kPa (170 tort). The sample was maintained in this environment for 15 minutes, after which heating of the substrate stage was discontinued. The sample was allowed to cool to room temperature and then removed.

The deposited film was found to have a shiny black appearance. Room temperature four point probe resistivity measurements gave a sheet resistance of about 100 ohms per square. The film thickness was found to be approximately 3000 Angstroms by profilometry. XRD showed the film to be a highly ordered cubic crystal structure presenting a {100}crystallographic surface. XRD and TEM analyses of this and similarly prepared samples analysis also indicated a very thin interfacial $R_1A_2C_3$ orthorhombic perovskite crystal structure, indicating that the first few unit cell lattice planes exhibited the $R_1A_2C_3$ orthorhombic perovskite crystal structure before formation of the cubic perovskite crystal structure began.

Example 2

Cubic Perovskite Crystal Structure Thin Film on $SrTiO_3$

A thin film was prepared similarly as described in Example 1, except that a monocrystalline $SrTiO_3$ substrate was substituted for the MgO substrate. Deposition was undertaken onto a {100} crystal face.

The cubic perovskite crystal structure thin film produced was similar to that observed in Example 1, but with the difference that no orthorhombic perovskite crystal structure was detected by XRD analysis. Ion channeling measurements indicated a significant degree of crystalline perfection, with an aligned minimum backscatter yield of 71%.

Example 3

The Effect of Temperature on Obtaining Orthorhombic or Cubic Perovskite Crystal Structure Thin Films on MgO Except as otherwise noted, the procedure employed was similar to that of Example 1. The heated substrate stage temperature was held at 700° C. during deposition. A total of 1500 laser pulses were used to grow the film. The introduction of oxygen at the conclusion of the run occurred with the heated substrate stage temperature maintained at 700° C. The heated stage was then cooled at controlled rate, reaching 200° C. after 90 minutes. At this point, the supply of heat to the substrate stage was discontinued, and the substrate was allowed to cool.

The thin film had a shiny black appearance. XRD analysis revealed it to a highly oriented $Y_1Ba_2Cu_3$ orthorhombic perovskite crystal structure with the unit cell c-axis normal to the substrate surface. Superconductivity ($T_o$) was observed at 86° C.

The significant difference between the procedure of Example 1 resulting in a cubic perovskite crystal structure and the procedure described above resulting in an orthorhombic perovskite crystal structure was that in Example 1 the temperature of the heated stage (and therefore the substrate) was maintained at 560° C. during deposition, whereas in the procedure described above the temperature of the heated stage during deposition was 700° C.

During further investigations the following relationships between the heating stage temperature during deposition and the observed thin film crystal structure were observed:

TABLE I

| Heat Stage (°C.) | Thin Film Crystal Form |
| --- | --- |
| 525 | Amorphous |
| 550 | Cubic Perovskite |
| 625 | Cubic Perovskite |
| 650 | Orthorhombic Perovskite |

At temperatures in the range of 525 to 550° C. a mixture of amorphous and cubic perovskite phases were observed. At temperatures in the range of 625 to 650° C. indications of a mixture of cubic and orthorhombic perovskite phases were observed.

Example 4

Thermal Stability of Cubic Perovskite Thin Films

A cubic perovskite thin film similar to that of Example 1 was heated to 700° C. and then examined by TEM analysis. No evidence of conversion to an orthorhombic perovskite crystal structure was observed.

When a procedure analogous to that described above was repeated, but with heating to 800° C. being undertaken and XRD analysis being employed, no evidence was found of the cubic perovskite crystal structure being converted to an orthorhombic perovskite crystal structure.

Example 5

Layer Arrangement for Josephson Junction Structure

This example demonstrates the formation of a three layer sequence of the type required for the formation of a Josephson junction structure.

Except as otherwise indicated the procedure of Example 1 was followed. The oxygen pressure during deposition was 26.7 Pa (200 mtorr), and the laser pulse energy was 350 mJ. A first layer was formed using a 700° C. heated stage and 800 laser pulses, giving a first layer thickness of about 800Å. This layer exhibited an orthorhombic perovskite $Y_1Ba_2Cu_3$ unit cell crystal structure similar to that described in Example 3. The second layer was a cubic perovskite crystal structure having a thickness of about 200Å. The second layer was similar to the thin film produced in Example 1. The third layer was formed similarly to the first layer with similar results.

XRD analysis of the resulting three layer thin film suggested the presence of both the orthorhombic and cubic perovskite phases. Ion channelling measurements using 3.45 Mev He ions indicated a high degree of Crystalline perfection throughout the film. Minimum backscattering yields of 73 percent at the surface and 45 percent near the interface with the substrate were found, indicating a higher degree of crystal perfection nearer the substrate interface and an epitaxial relationship of layers throughout the film.

Example 6

Josephson Junction Device Construction

As specifically described below, a thin film Josephson layer sequence was deposited on a magnesium oxide substrate surface. $YBa_2Cu_3O_{7-w}$ was chosen to form the high temperature superconductive crystalline oxide layers USCO" and OSCO" while the layer ICCO" was formed of a cubic perovskite crystal structure containing the same metal atoms in the same atomic ratio. The Josephson junction layer sequence (and hence the individual superconductive layers) exhibited superconductivity at temperatures well above 30° K. and a critical temperature estimated to be 90° K. The entire Josephson junction layer sequence was deposited in a single vacuum pumpdown using a single laser ablation target.

A step-by-step description of device preparation and testing follows:

A. Formation of the Josephson Junction Layer Sequence

A polished 2.54 cm×2.54 cm×0.10 cm {100} surface of a monocrystalline magnesium oxide wafer was used as a substrate. The wafer was mounted on a resistively heated block within a vacuum deposition chamber. Silver paint was used as a heat transfer agent between the heater block and the substrate. The substrate was initially heated to 700° C. in air. The deposition chamber was then pumped to a base pressure of $1.33\times10^{-6}$ kPa ($10^{-5}$ torr). Next, flowing oxygen was introduced into the chamber near the substrate while pumping continuously. A flow rate of 30 cc/min and an oxygen pressure of $2.0\times10^{-2}$ kPa (150 mtorr) was established.

The substrate location was 5 cm from a polycrystalline $YBa_2Cu_3O_{-w}$ (w<0.1) target in a direction perpendicular to the target surface. The polycrystalline target was prepared using a conventional technique (see Shaw et al U.S. Pat. No. 4,874,741). The target was rotated at 6 rpm so that laser exposure would strike different surfaces and average out any local nonuniformities in the target. With a shutter introduced between the target and the substrate 150 pulses from a Lambda Physik model 210 i (trademark) laser operating in the 248 nm KrF line were made to irradiate the rotating target. Each pulse was characterized by an energy of about 400 mJ and duration of about 30 ns. The spot size on target was 3 mm by 10 mm. The laser was operated at a repetition rate of 2 Hz.

The shutter was then retracted, and, with the substrate heater at 700° C., an oxide precursor of a high temperature superconductive crystalline oxide thin film having an orthorhombic perovskite crystal structure was deposited on the substrate using 7500 pulses. Next the heat block temperature was lowered to 560° C. and 300 pulses were fired. These 300 pulses resulted in the epitaxial deposition of an cubic perovskite interlayer on the superconductive thin film. At this point the substrate temperature was brought back to. 700° C. and a third layer was epitaxially deposited using 1500 pulses as a precursor of an orthorhombic perovskite high temperaturate superconductive crystalline oxide thin film. For each layer a growth rate of approximately 1Å per pulse was observed. After deposition of the upper layer, the oxygen pressure within the chamber was increased to 18.0 kPa (135 tort) in about 1 minute. The sample was then cooled to 200° C. in 90 minutes and then removed from the chamber. This completed formation of the Josephson junction layer sequence on the substrate.

B. Protecting a Selected Area of the Josephson Junction Layer Sequence

A commercially available positive-working photoresist (PPH 3135-4.5, sold by Chem Tech Industries, Inc.), hereinafter referred to as PWPR-1, was spin coated at 3000 rpm for 10 sec over the Josephson junction layer sequence to produce a protective layer having at thickness of 0.5 μm. The protective layer was prebaked at 90° C. for 30 minutes and then postbaked at 110° C. for 30 minutes. Subsequent investigations revealed the prebaking step to be optional.

A 200Å chromium layer was deposited over the PWPR-1 layer followed immediately by the deposition of a gold layer 1 μm in thickness. Deposition was undertaken using electron beam evaporation in a vacuum system.

To pattern the gold and chromium layers a commercially available positive-working photoresist (PPH 3135-30.5, sold by Chem Tech Industries, Inc.), hereinafter referred to as PWPR-2, was spin coated over the gold layer at 6000 rpm for 30 sec to produce a layer 1.6 μm in thickness. The layer was prebaked at 90° C. for 30 minutes. The PWPR-2 layer was imagewise exposed with ultraviolet light at an intensity of 10 mW/cm$^2$ for 45 sec through a mask. The mask had line openings varying in width from 10 to 50 μm. PWPR-2 was developed in a commercial developer (PPD 5135 sold by Chem Tech Industries, Inc.), hereinafter referred to as PRD, diluted in a 1:1 volume ratio with water. Development time was 55 sec, with exposed portions of PWPR-2 being removed. After development the workpiece was rinsed in water for 45 seconds and then blown dry.

The gold layer and underlying chromium layer were next removed in areas unprotected by PWPR-2. A gold etchant was prepared by mixing 100 g potassium iodide and 25 g iodine in 1 L of water. The etchant was placed in a nitrogen bubbler tank. The gold etchant as spread over the surface of PWPR-2 and the line openings formed in this layer. Etching was conducted for 140 sec, followed by a 2 minute rinse in water. The chromium etchant was similarly applied, and an etch time of 40 sec was employed, followed by a 2 minute rinse in water. The commercially available chromium etchant (TFD made by Transene Co.) was employed.

After etching was complete a plasma was used to remove the portions of PWPR-2 remaining overlying the superimposed gold and chromium layers. In addition exposed underlying portions of PWPR-1 were also removed by this step. A planar plasma etcher, model PEII-A made by Technics, Inc., was used. The etcher was operated at a power level of 200 W, a pressure of 26.7 Pa (200 mtorr) for 10 minutes.

C. Limiting the Josephson Junction Layer Sequence to the Selected Area and Removing the Gold and Chromium Layers Using the patterned gold and chromium layers as a protective mask the Josephson junction layer sequence was implanted with silicon atoms using the following doses and energies:

$1\times10^{15}$ atoms/cm$^2$ at 400 KeV;
$2\times10^{15}$ atoms/cm$^2$ at 1 MeV; and
$3\times10^{15}$ atoms/cm$^2$ at 1.5 MeV.

This implantation was determined by calculation to be sufficient to destroy superconductivity to a depth of 1 μm and therefore was more than sufficient to convert unprotected portions of the Josephson junction layer sequence to a nonsuperconductive layer laterally the protected portions of the Josephson junction layer sequence within the selected area.

To create a visual pattern for achieving alignments in subsequent steps a brief ion milling or etching step was done to remove 300Å of the nonsuperconductive layer surface. The Josephson junction layer sequence in the selected area was protected from ion milling by the gold and chromium layers. Ion milling was accomplished using an argon ion beam, a current density of 0.62 mA/cm$^2$ a potential of 500 V, and a milling time of 60 sec. The argon beam was directed along the length of the workpiece at an angle of incidence of 60° measured from an axis perpendicular to the upper surface of the workpiece.

After ion milling to mark the surface the gold and chromium layers were lifted off by placing the workpiece in acetone and employing ultrasonic agitation for 4 minutes. The PWPR-1 layer was removed also. The workpiece was then rinsed in isopropyl alcohol and blown dry.

D. Cross-Strip Electrode Fabrication

To insure removal of residual organic material from the surface of the workpiece improve adhesion of the electrodes to the surface the surface of work piece subjected to an oxygen plasma. The previously used plasma etcher was again employed, but at a power level of 50 watts, an oxygen pressure of 26.7 Pa (200 mtorr) and for a time of 2 minutes.

Using the procedures previously described for chromium and gold layer formation a 200Å chromium layer followed by a 2000Å gold layer were formed on the surface of the workpiece. These layers were patterned into cross-strips (strips having their longest axes oriented perpendicular the longest axes of the selected areas) using a procedure similar to that used to form and pattern PWPR-2, except that initial deposition of photoresist was at 3000 rpm for 30 second, yielding a photoresist layer thickness of 2 μm.

Ion beam milling was next undertaken to remove the chromium and gold layers in areas not protected by the overlying photoresist layer and to remove unprotected portions of the oxide layers down to a depth revealing the first formed high temperature superconductive crystalline oxide thin film. Ion milling was conducted as previously described, but the duration of ion milling was 23 minutes and 8 sec rather than only 60 sec.

After ion milling the photoresist was again removed in an acetone bath followed by isopropyl alcohol rinsing, as previously described. This brought the device to stage of completion comparable to the form of devices 100 and 200 as shown in FIGS. 1 to 3 inclusive.

The invention has been described in detail with particular reference to preferred embodiments thereof, but it will be understood that variations and modifications can be effected within the spirit and scope of the invention.

What is claimed is:

1. A Josephson junction device comprised of a substrate and a Josephson junction layer sequence comprised of an underlying high temperature superconductive crystalline copper oxide layer, an overlying high temperature superconductive crystalline copper oxide layer, and an impedance controlling crystalline copper oxide layer interposed between the superconductive layers,

CHARACTERIZED IN THAT the underlying superconductive crystalline copper oxide layer is located on a portion of a major surface of the substrate in a selected area, a first nonsuperconductive copper oxide layer portion only lies on the substrate and laterally abuts and laterally surrounds the underlying superconductive crystalline copper oxide layer the impedance controlling crystalline copper oxide layer overlies the underlying superconductive layer in only a portion of the selected area to leave a portion of the underlying superconductive crystalline Copper oxide layer free of an overlying oxide layer, a second nonsuperconductive copper oxide layer portion overlies the first nonsuperconductive copper oxide layer and laterally abuts the impedance controlling layer, the overlying superconducting crystalline copper oxide layer overlies only the impedance controlling layer, a third nonsuperconductive copper oxide layer portion overlies only the second nonsuperconductive copper oxide layer and laterally abuts the overlying superconducting crystalline copper oxide layer, and an electrical conductor is attached to the overlying superconductive crystalline copper oxide layer and extends laterally over at least a portion of the third nonsuperconductive copper oxide layer portion.

2. A Josephson junction device according to claim 1 further characterized in that the first, second and third nonsuperconductive copper oxide layer portions laterally surround the selected area and present a substantially planar surface.

3. A Josephson junction device according to claim 1 further characterized in that two portions of the underlying superconductive crystalline copper oxide layer are free of the overlying impedance controlling crystalline copper oxide layer and an overlying oxide layer.

4. A Josephson junction device according to claim 1 further characterized in that each of the second and third nonsuperconductive copper oxide layer portions is divided into two segments laterally separated by the selected area, and the electrical conductor is divided into first and second laterally spaced segments, each of the first and second segments overlying one segment of the third nonsuperconductive copper oxide layer portion and a portion of the overlying superconductive oxide layer.

5. A Josephson junction device according to claim 1 further characterized in that each of the impedance controlling crystalline copper oxide layer and the overlying superconductive crystalline copper oxide layer are divided into two segments located at laterally spaced locations on the underlying superconductive crystalline copper oxide layer.

6. A Josephson junction device according to claim 4 further characterized in that the underlying superconductive crystalline copper oxide layer forms an electrical conduction path between the laterally separated segments of the impedance controlling crystalline copper oxide layer.

7. A Josephson junction device comprised of a substrate and a Josephson junction layer sequence comprised of an underlying high temperature superconductive crystalline copper oxide layer, an overlying high temperature superconductive crystalline copper oxide layer, and an impedance controlling crystalline copper oxide layer interposed between the superconductive layers,

CHARACTERIZED IN THAT the underlying superconductive crystalline copper oxide layer is located on a portion of a major surface of the substrate in a selected area, a first nonsuperconductive copper oxide layer portion only lies on the substrate and laterally abuts and laterally surrounds the underlying superconductive crystalline laterally copper oxide layer, the impedance controlling crystalline copper oxide layer overlies the underlying superconductive layer in only a central portion of the selected area to leave two portions of the underlying superconductive crystalline copper oxide layer free of an overlying oxide layer, a second nonsuperconductive copper oxide layer portion overlies the first nonsuperconductive copper oxide layer and is divided into two segments each of which laterally abuts the impedance controlling layer, the overlying superconducting crystalline copper oxide layer overlies only the impedance controlling layer, a third nonsuperconductive copper oxide layer portion in the form of first and second laterally spaced segments each of which overlies only one segment of the second nonsuperconductive copper oxide layer and laterally abuts the overlying superconducting crystalline copper oxide layer, first and second electrical conductors attached to different portions of the underlying superconductive crystalline copper oxide layer free of an overlying oxide layer, and third and fourth electrical conductors attached to the overlying superconductive crystalline copper oxide layer so that the third conductor extends laterally over the first segment of the third nonsuperconductive copper oxide layer portion and the fourth conductor extends over the second segment of the third nonsuperconductive oxide layer portion.

8. A Josephson junction device comprised of a substrate and a Josephson junction layer sequence comprised of an underlying high temperature superconductive crystalline copper oxide layer, an overlying high temperature superconductivmpcryscalline copper oxide layer, and an impedance controlling crystalline copper oxide layer interposed between the superconductive layers,

CHARACTERIZED IN THAT the underlying superconductive crystalline copper oxide layer is located on a portion of a major surface of the substrate in a selected area, a first nonsuperconductive copper oxide layer portion only lies on the substrate and laterally abuts and laterally surrounds the underlying superconductive crystalline copper oxide layer, the impedance controlling crystalline copper oxide layer is divided into two laterally spaced segments which overlie the underlying superconductive layer in only a portion of the selected area to leave an intervening portion of the underlying superconductive crystalline copper oxide layer free of any overlying oxide layer, a second nonsuperconductive copper oxide layer portion overlies the first nonsuperconductive copper oxide layer and laterally abuts the impedance controlling layer, the overlying superconducting crystalline copper oxide layer is divided into first and second segments each of which overlies a different segment of the impedance controlling layer, a third nonsuperconductive copper oxide layer portion overlies only the second nonsuperconductive copper oxide layer and laterally abuts the overlying superconducting crystalline copper oxide layer, a first electrical conductor is attached to the first segment of the overlying superconductive crystalline copper oxide layer and extends laterally over at least a portion of the third nonsuperconductive copper oxide layer portion, and a second laterally spaced electrical conductor is attached to the second segment of the overlying superconductive crystalline copper oxide layer and extends laterally over at least a portion of the third nonsuperconductive copper oxide layer portion.

9. A Josephson junction device according to claim 1 further characterized in that the superconductive crystalline copper oxide layers each exhibit an $R_1A_2C_3$ orthorhombic perovskite crystal structure.

10. A Josephson junction device according to claim 9 further characterized in that the impedance controlling crystalline copper oxide layer exhibits a cubic perovskite crystal structure.

* * * * *